(12) United States Patent
Dordi et al.

(10) Patent No.: US 8,524,329 B2
(45) Date of Patent: Sep. 3, 2013

(54) ELECTROLESS COPPER DEPOSITION

(75) Inventors: Yezdi N. Dordi, Palo Alto, CA (US); Richard P. Janek, Oakland, CA (US); Dries Dictus, Kessel-Lo (BE)

(73) Assignee: Lam Research Corporation, Fremont, CA (US)

( * ) Notice: Subject to any disclaimer, the term of this patent is extended or adjusted under 35 U.S.C. 154(b) by 77 days.

(21) Appl. No.: 13/324,939

(22) Filed: Dec. 13, 2011

(65) Prior Publication Data
US 2013/0149461 A1 Jun. 13, 2013

(51) Int. Cl.
H05H 1/00 (2006.01)

(52) U.S. Cl.
USPC .......................................... 427/537; 427/99.5

(58) Field of Classification Search
USPC ............. 427/97.9, 98.1, 98.8, 99.5, 304, 305, 427/306, 535, 536, 537; 438/653, 677
See application file for complete search history.

(56) References Cited

U.S. PATENT DOCUMENTS

| | | | |
|---|---|---|---|
| 6,893,956 B2 | 5/2005 | Ruelke et al. | |
| 7,169,215 B2 | 1/2007 | Shacham-Diamond et al. | |
| 7,244,683 B2 | 7/2007 | Chung et al. | |
| 7,651,934 B2 | 1/2010 | Lubomirsky et al. | |
| 7,683,488 B2 | 3/2010 | Itani | |
| 7,842,356 B2 | 11/2010 | Ishikawa | |
| 8,017,519 B2 | 9/2011 | Ishikawa | |
| 2006/0160372 A1 | 7/2006 | Dorfman | |
| 2011/0053375 A1* | 3/2011 | Ishikawa et al. | 438/674 |

FOREIGN PATENT DOCUMENTS

WO WO 2009090912 A1 * 7/2009

OTHER PUBLICATIONS

Charbonnier et al, Electroless Plating of glass and silicon substrates, through, surface pretreatments involving plasma polymerization and grafting process, 2004, The Journal of Adhesion, vol. 80:12; 1103-1130.*

Ishikawa et al., "Evaluation of New Amorphous Hydrocarbon Film for Copper Barrier Dielectric Film in Low-k Copper Metallization," Japanese Journal of Applied Physics; vol. 47, No. 4; 2008; pp. 2531-2534.

Charbonnier et al., "Electroless Plating of Glass and Silicon Substrates Through Surface Pretreatments Involving Plasma-Polymerization and Grafting Processes," The Journal of Adhesion; vol. 80; 2004; pp. 1103-1130.

Loscutoff et al., "Molecular Layer Deposition of Nanoscale Organic Films for Copper Diffusion Barriers," Abstract; 28th Advanced Metallization Conference 2011; 2 pages.

* cited by examiner

*Primary Examiner* — Dah-Wei Yuan
*Assistant Examiner* — Nga Leung V Law
(74) *Attorney, Agent, or Firm* — Beyer Law Group LLP (57) ABSTRACT

A method for providing electroless plating is provided. An amorphous carbon barrier layer is formed over the low-k dielectric layer by providing a flow a deposition gas, comprising a hydrocarbon, $H_2$, and an oxygen free diluent, forming a plasma from the deposition gas, and stopping the flow of the deposition gas. The amorphous carbon barrier layer is conditioned by providing a flow of a conditioning gas comprising $H_2$ and a diluent, forming a plasma from the conditioning gas, which conditions a top surface of the amorphous carbon barrier layer, and stopping the flow of the conditioning gas. The amorphous carbon barrier layer is functionalized by providing a flow of a functionalizing gas comprising $NH_3$ or $H_2$ and $N_2$, forming a plasma from the functionalizing gas, and stopping the flow of the functionalizing gas. An electroless process is provided to form an electrode over the barrier layer.

18 Claims, 8 Drawing Sheets

ELECTROLESS COPPER DEPOSITION

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. If the metal interconnects contain copper, a copper barrier layer is used to prevent copper poisoning of the low-k dielectric layer.

SUMMARY OF THE INVENTION

To achieve the foregoing and in accordance with the purpose of the present invention, a method for providing electroless plating over a low-k dielectric layer is provided. An amorphous carbon barrier layer is formed over the low-k dielectric layer by providing a flow of a deposition gas, comprising a hydrocarbon, $H_2$, and an oxygen free diluent, forming a plasma from the deposition gas to provide the amorphous carbon barrier layer, and stopping the flow of the deposition gas. The amorphous carbon barrier layer is conditioned by providing a flow of a conditioning gas comprising $H_2$ and an oxygen free diluent, forming a plasma from the conditioning gas, which conditions a top surface of the amorphous carbon barrier layer, and stopping the flow of the conditioning gas. The conditioned amorphous carbon barrier layer is functionalized by providing a flow of a functionalizing gas comprising $NH_3$ or $N_2$ and $H_2$ or a mixture of all of them, forming a plasma from the functionalizing gas, and stopping the flow of the functionalizing gas.

In another manifestation of the invention, an apparatus is provided. A plasma processing chamber is provided, comprising a chamber wall forming a plasma processing chamber enclosure, a substrate support for supporting a wafer within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. At least one RF power source is electrically connected to the at least one electrode. A gas source is in fluid connection with the gas inlet. A controller is controllably connected to the gas source and the at least one RF power source. The controller comprises at least one processor and computer readable media. The computer readable media comprises computer readable code for forming an amorphous carbon barrier layer over the low-k dielectric layer, comprising computer readable code for providing a flow a deposition gas, comprising a hydrocarbon, $H_2$, and an oxygen free diluent, computer readable code for forming a plasma from the deposition gas to provide the amorphous carbon barrier layer, and computer readable code for stopping the flow of the deposition gas, computer readable code for conditioning the amorphous carbon barrier layer, comprising computer readable code for providing a flow of a conditioning gas comprising $H_2$ and an oxygen free diluent, computer readable code for forming a plasma from the conditioning gas, which conditions a top surface of the amorphous carbon barrier layer, and computer readable code for stopping the flow of the conditioning gas, and computer readable code for functionalizing the conditioned amorphous carbon barrier layer, comprising computer readable code for providing a flow of a functionalizing gas comprising $NH_3$ or $N_2$ and $H_2$ or a mixture of all of them, computer readable code for forming a plasma from the functionalizing gas, and computer readable code for stopping the flow of the functionalizing gas.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the formation of semiconductor devices using a dual damascene process, features such as trenches or vias are formed in a low-k dielectric layer. Copper interconnects are formed within the features. To prevent copper poisoning, a barrier layer, such as tantalum nitride (TaN), is placed between the low-k dielectric layer and the copper interconnect. A copper seed layer is formed over the barrier layer. The copper seed layer is used for electroplating to grow a copper contact. As device size shrinks, it is desirable to provide thinner copper barrier layers and possibly eliminate the copper seed layer in order to allow copper to fill more of the feature volume.

Figure 1:
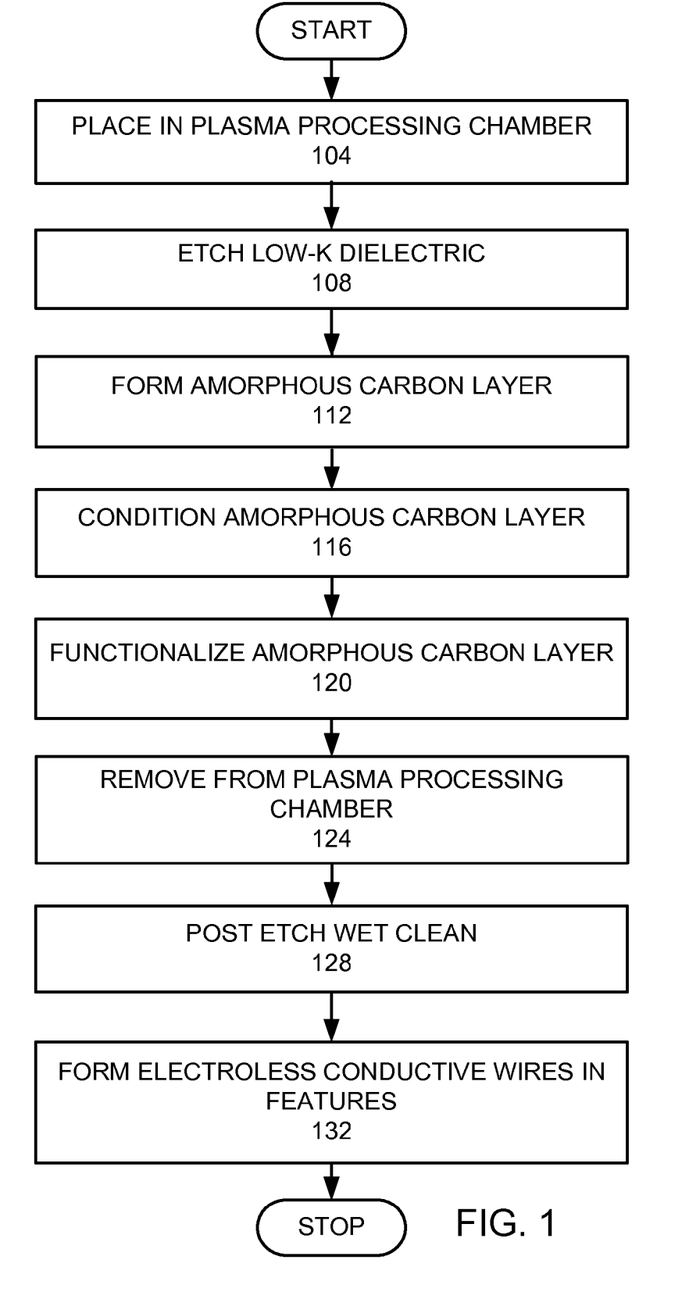
FIG. 1 is a flow chart of an embodiment of the invention.

FIG. 1 is a high level flow chart of an embodiment of the invention. In this embodiment, a substrate is placed in a plasma processing chamber (step 104). A low-k dielectric layer is formed above the substrate. The low-k dielectric layer is etched in the plasma processing chamber (step 108). An amorphous carbon layer is formed over the low-k dielectric layer (step 112). The amorphous carbon layer is conditioned (step 116). The conditioned amorphous carbon layer is functionalized (step 120). The substrate is removed from the plasma processing chamber (step 124). The substrate is subjected to a post etch wet clean (step 128). Electroless conductive wires are formed in the features (step 132).

Figure 2A:
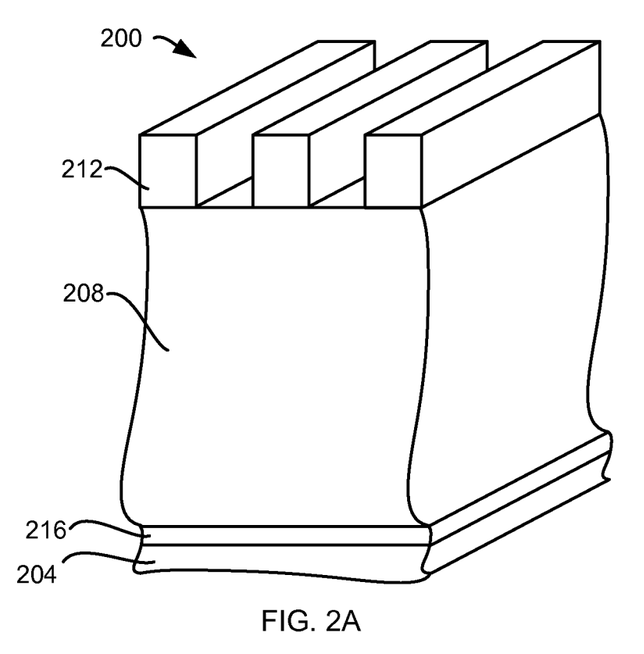
FIGS. 2A-D are schematic views of the formation of structures using the inventive process.

In a preferred embodiment of the invention, a substrate is placed in a plasma processing chamber (step 104). FIG. 2A is a cross-sectional view of a stack 200 with a substrate 204 with a low-k dielectric layer 208 disposed below a photoresist mask 212. In this example, one or more layers 216 are disposed between the substrate and the low-k dielectric layer 208. In this example the low-k dielectric layer is porous low-k dielectric. Generally, the low-k dielectric may be CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif.; HOSP™ from Allied Signal of Morristown, N.J.; SiLK™ or advanced porous SiLK from DOW Chemical Company; Orion® Flowfill™ from Trikon; and LKD™ from JSR Corp. More specifically, in this example the low-k dielectric layer is porous organosilicate glass (OSG). In other embodiments, other low-k materials may be used. In the specification and claims, a low-k dielectric material has a dielectric constant of less than 3.0.

Figure 3:
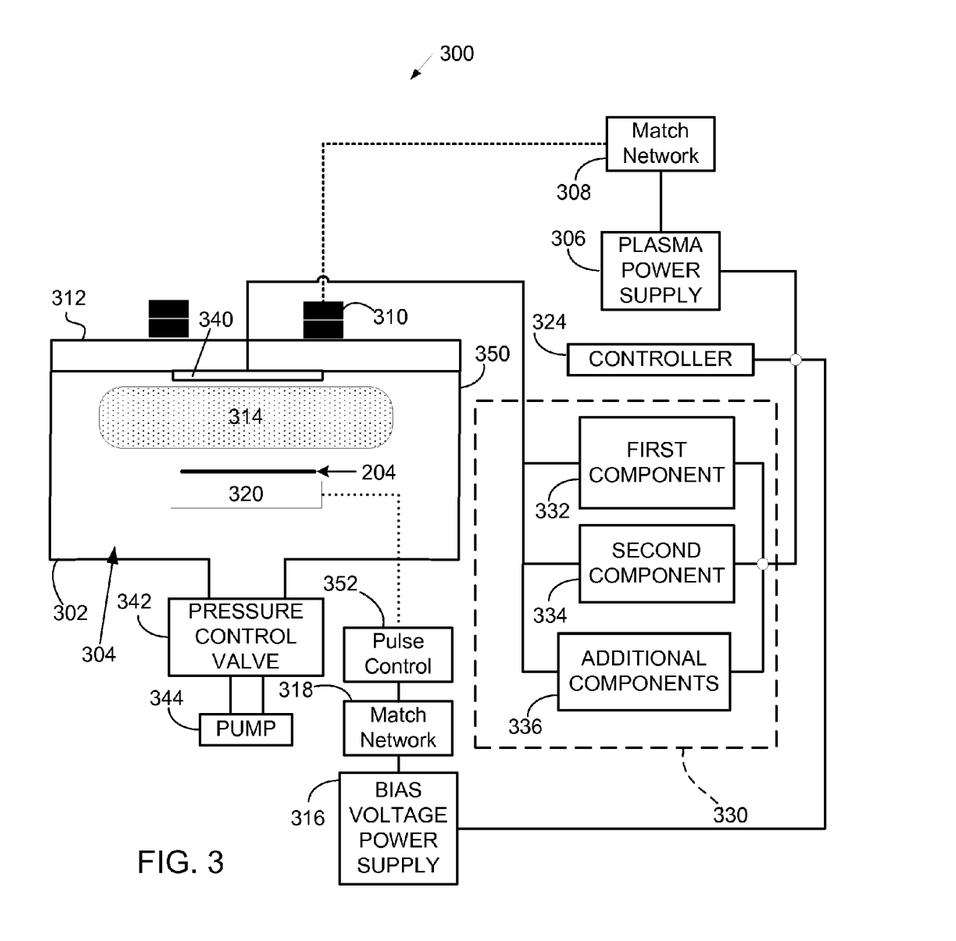
FIG. 3 is a schematic view of a plasma processing chamber that may be used in an embodiment of the invention.

FIG. 3 schematically illustrates an example of a plasma processing system 300 which may be used in one embodiment of the present invention. The plasma processing system 300 includes a plasma reactor 302 having a plasma processing chamber 304 therein defined by a chamber wall 350. A plasma power supply 306, tuned by a match network 308, supplies power to a TCP coil 310 located near a power window 312 to be an electrode that provides power to the plasma processing chamber 304 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on the wafer 204 which is supported by the electrode 320, so that the electrode 320 in this embodiment is also a substrate support. A pulse controller 352 causes the bias voltage to be pulsed. The pulse controller 352 may be between the match network 318 and the substrate support or between the bias voltage power supply 316 and the match network 318 or between the controller 324 and the bias voltage power supply 316 or in some other configuration to cause the bias voltage to be pulsed. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 60 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 100 to 10000 Watts, and the wafer bias voltage power supply 316 may supply a bias voltage in a range of 10 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a first component gas source 332, a second component gas source 334, and optionally additional component gas sources 336. The various component gases will be discussed below. The gas sources 332, 334, and 336 are in fluid connection with processing chamber 304 through a gas inlet 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342, which is a pressure regulator, and a pump 344, which also serves to maintain a particular pressure within the plasma processing chamber 304 and also provides a gas outlet. The gas source/gas supply mechanism 330 is controlled by the controller 324. A Kiyo system by Lam Research Corporation may be used to practice an embodiment of the invention.

Figure 4:
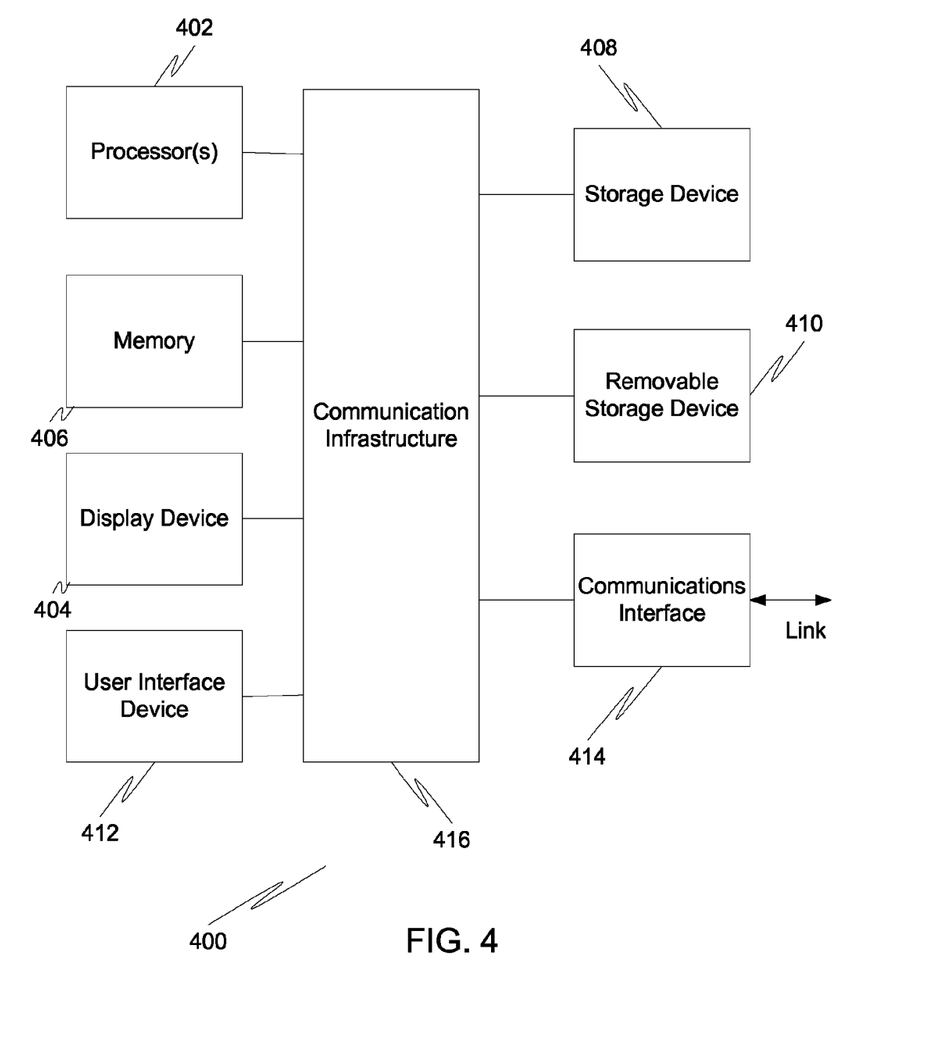
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
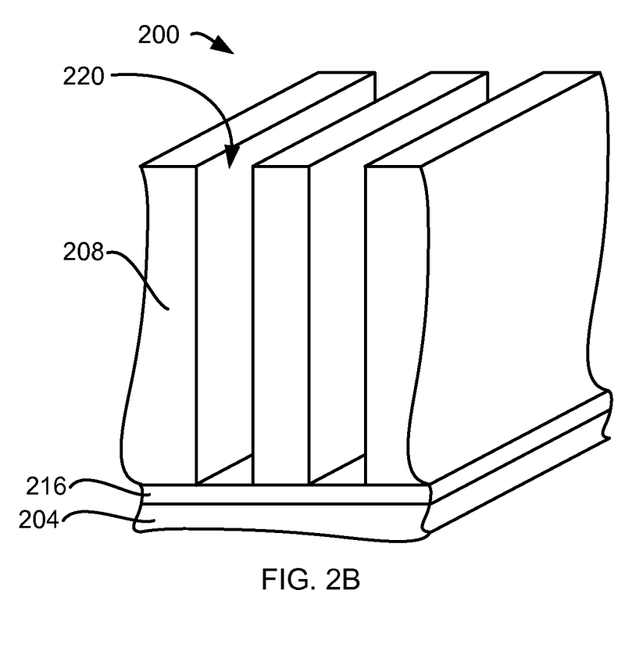
Figure 5:
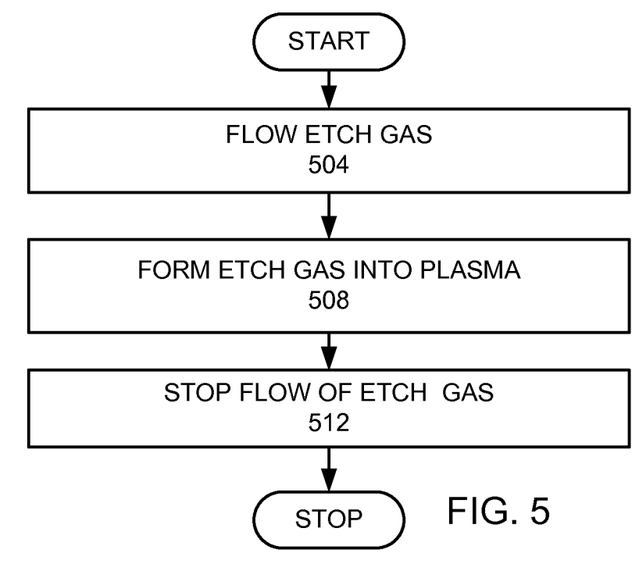
FIG. 5 is a more detailed flow chart of the etch step.

The low-k dielectric layer is etched (step 108). FIG. 5 is a more detailed flow chart of the low-k dielectric layer etch. An etch gas is flowed into the plasma processing chamber 304 (step 504). To etch a porous OSG low-k dielectric layer, the etch gas comprises $C_4F_6$, $O_2$, and Ar. RF is provided to form the etch gas into a plasma (step 508), which etches the low-k dielectric layer to form features. The flow of the etch gas is stopped when the etch is completed (step 512). FIG. 2B is a cross-sectional view of the stack 200 after the etch is completed forming etch features 220.

Figure 6:
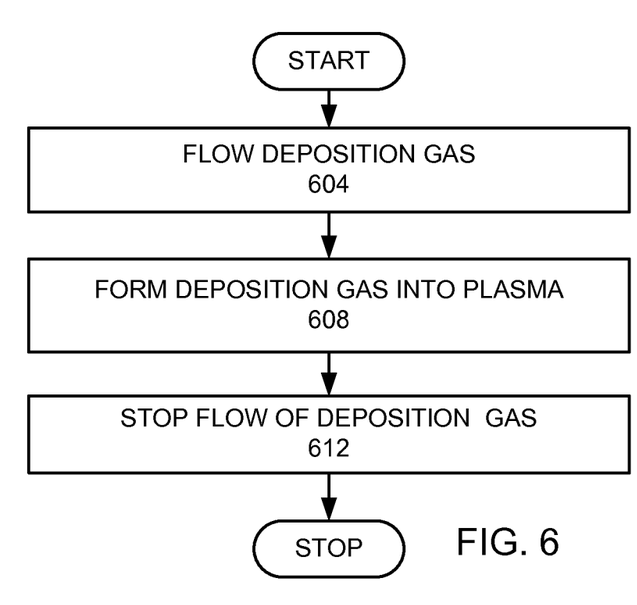
FIG. 6 is a more detailed flow chart of the amorphous carbon deposition step.

An amorphous carbon layer is formed over the low-k dielectric layer (step 112). In this embodiment, both the etching of the low-k dielectric layer is performed in the same plasma processing chamber 304. In other embodiments, the etching may be performed in one chamber and the deposition of the amorphous carbon layer may be done in another chamber in the same cluster of chambers, so that a vacuum is maintained as the substrate is passed from the etching chamber to a deposition chamber. FIG. 6 is a more detailed flow chart of the deposition of the amorphous carbon layer. A deposition gas is flowed into the plasma processing chamber (step 604). The deposition gas comprises a hydrocarbon, $H_2$, and an oxygen free inert diluent. The hydrocarbon is at least one of $C_xH_yF_z$ or $C_xH_y$. More preferably, the hydrocarbon is fluorine free and therefore is of the form $C_xH_y$. Most preferably, the hydrocarbon is $CH_4$. The oxygen free diluent may be any inert diluent that does not contain oxygen. More preferably, the oxygen inert diluent comprises one of nitrogen or a noble gas. More preferably, the inert diluent is helium. Preferably, the deposition gas provides a hydrocarbon flow to maintain a hydrocarbon partial pressure between 0.1 mTorr and 10 mTorr. More preferably, the partial pressure of the hydrocarbon is between 1 mTorr and 5 mTorr. Most preferably, the partial pressure of the hydrocarbon is about 2 mTorr. The low partial pressure of the hydrocarbon helps to provide a thin amorphous carbon layer. The deposition gas is formed into a plasma (step 608). The plasma from the deposition gas is used to form an amorphous carbon layer over the low-k dielectric layer. The flow of the deposition gas is stopped (step 612).

An example of a deposition recipe provides a pressure of 20 mTorr. The gas source/gas supply mechanism 330 provides 50 sccm $CH_4$, 350 sccm $H_2$, and 200 sccm He into the plasma processing chamber 304 (step 604). The plasma power supply 306 provides 500 Watts of inductive RF power at 13.56 MHz to the chamber to form the conditioning gas into a plasma (step 608). The wafer bias voltage power supply 316 provides a bias of 0 volts to the wafer 204. Generally, the bias is less than 300 volts. In this embodiment the bias has a frequency of 13.56 MHz.

Figure 2C:
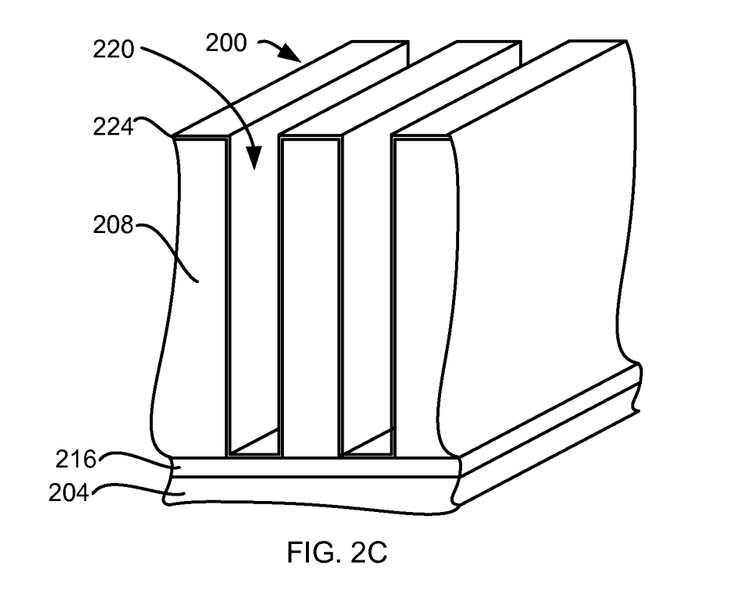

FIG. 2C is a cross-sectional view of the stack after an amorphous carbon deposition layer 224 has been deposited. Preferably, the amorphous carbon layer has a thickness between 0.5 nm and 100 nm. More preferably, the amorphous carbon layer has a thickness of 0.5 nm to 5 nm. It should be noted that the drawings are not to scale in order to clearly show the amorphous carbon deposition layer 224.

Figure 7:
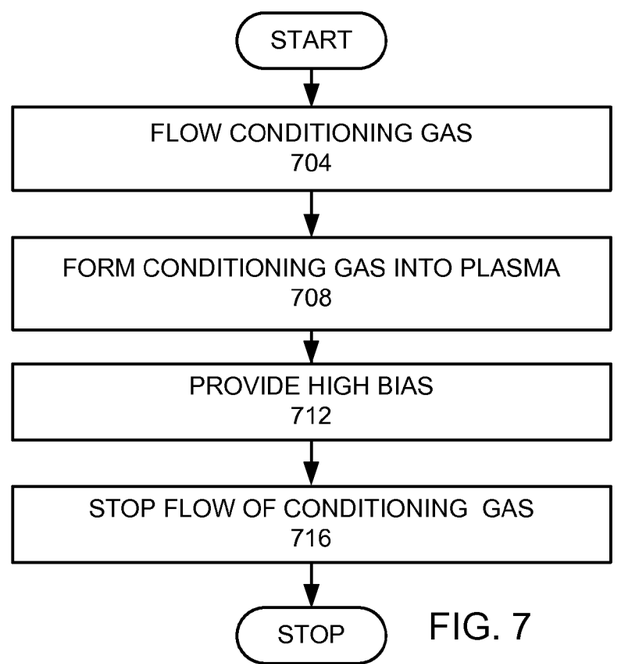
FIG. 7 is a more detailed flow chart of the amorphous carbon conditioning step.

The amorphous carbon layer is conditioned (step 116). In this embodiment, the conditioning of the amorphous carbon is performed in the same plasma processing chamber 304. In other embodiments, the conditioning may be done in a different chamber in the same cluster of chambers, so that a vacuum is maintained as the substrate is passed from the deposition chamber to a conditioning chamber. FIG. 7 is a more detailed flow chart of the conditioning of the amorphous carbon layer. A conditioning gas is flowed into the plasma processing chamber (step 704). The conditioning gas comprises a hydrocarbon, $H_2$, and an oxygen free inert diluent. The oxygen free inert diluent may be any inert diluent that does not contain oxygen. More preferably, the oxygen free inert diluent comprises one of nitrogen or a noble gas. More preferably, the inert diluent is helium. Preferably, the conditioning gas is essentially free of hydrocarbons. Being essentially free of hydrocarbons is defined as having such a low concentration of hydrocarbons such that there is no carbon deposition. Most preferably, the conditioning gas is hydrocarbon free. Preferably, $H_2$ has a partial pressure of between 1 and 100 mTorr. More preferably, $H_2$ has a partial pressure between 5 and 30 mTorr. This high partial pressure of $H_2$ improves the conditioning of the amorphous carbon layer. The conditioning gas is formed into a plasma (step 708). A high bias is provided (step 712). The high bias is defined as having a higher bias than the bias during the deposition of the amorphous carbon layer and the bias during the functionalizing of the conditioned amorphous carbon barrier layer. More specifically, it is preferred that the bias is between 10 and 200 volts. The bias voltage may be provided by the bias voltage power supply 316. The plasma from the conditioning gas is used to condition the amorphous carbon layer over the low-k dielectric layer. It is believed that the conditioning either trims, densifies, or cleans the amorphous carbon layer. The flow of the conditioning gas is stopped (step 716).

An example of a conditioning recipe provides a pressure of 20 mTorr. The gas source/gas supply mechanism 330 provides 350 sccm $H_2$ and 200 sccm He into the plasma processing chamber 304 (step 704). The plasma power supply 306 provides 500 Watts of inductive RF power at 13.56 MHz to the chamber to form the deposition gas into a plasma (step 708). The wafer bias voltage power supply 316 provides a bias of 200 volts to the wafer 204 (step 712). In this embodiment, the bias has a frequency of 13.56 MHz.

Figure 8:
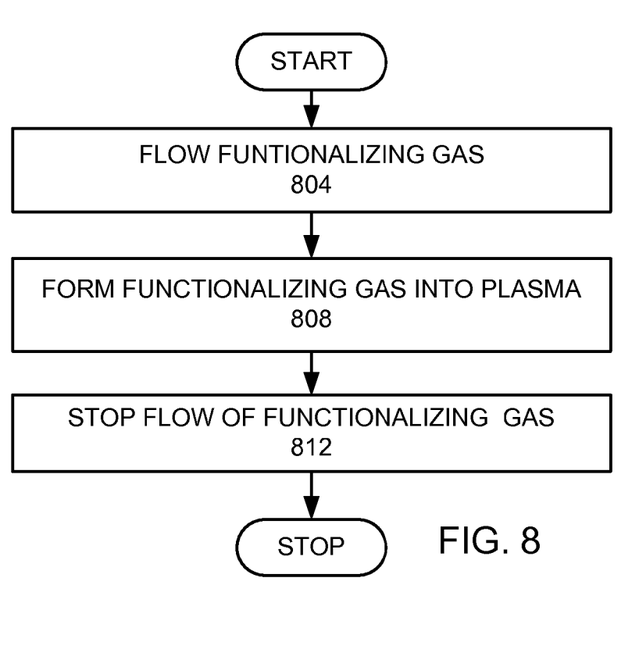
FIG. 8 is a more detailed flow chart of the functionalization of the conditioned amorphous carbon barrier layer.

The conditioned amorphous carbon layer is functionalized (step 112). In the specification, the functionalizing of the conditioned amorphous carbon layer is defined as grafting nitrogen functionalities on the conditioned amorphous carbon layer to increase electroless copper deposition. In this embodiment, the functionalizing of the conditioned amorphous carbon is performed in situ in the same plasma processing chamber 304. In other embodiments, the functionalizing may be done in a different chamber in the same cluster of chambers, so that a vacuum is maintained as the substrate is passed from the conditioning chamber to a functionalizing chamber. FIG. 8 is a more detailed flow chart of the functionalizing of the conditioned amorphous carbon layer. A functionalizing gas is flowed into the plasma processing chamber (step 804). The functionalizing gas comprises $NH_3$ or $N_2$ and $H_2$. Preferably, the functionalizing gas is essentially free of hydrocarbons. Being essentially free of hydrocarbons is defined as having such a low concentration of hydrocarbons such that there is no carbon deposition. Most preferably, the functionalizing gas is hydrocarbon free. Preferably, the functionalizing gas comprises $NH_3$, which can be mixed with $N_2$, $H_2$ and/or noble carrier gases The functionalizing gas is formed into a plasma (step 808). The flow of the functionalizing gas is stopped (step 816).

An example of a functionalizing recipe provides a pressure of 50 mTorr. The gas source/gas supply mechanism 330 provides 100 sccm $NH_3$ into the plasma processing chamber 304 (step 804). The plasma power supply 306 provides 500 Watts of inductive RF power at 13.56 MHz to the chamber to form the functionalizing gas into a plasma (step 808). The wafer bias voltage power supply 316 provides a bias of 0 volts to the wafer 204.

Figure 9:
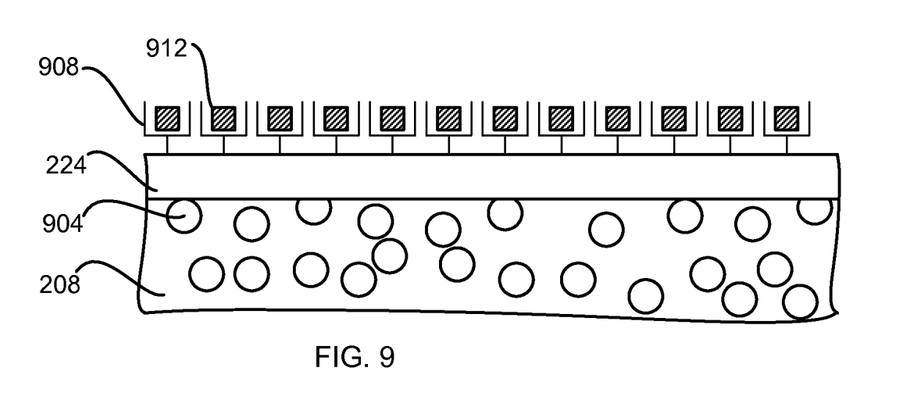
FIG. 9 is a schematic view of the functionalized and conditioned amorphous carbon barrier layer.

Without being bound by theory, it is believed that the functionalization is self-limiting, so that a monolayer of the nitrogen functionalization is formed on the surface of the conditioned amorphous carbon layer. FIG. 9 is an enlarged cross-sectional view of part of the low-k dielectric layer 208. In this example, the low-k dielectric layer 208 is porous, as indicated by the pores 904. It is believed that the deposited amorphous carbon layer 224 helps to seal and protect the porous low-k dielectric layer 208, in addition to providing a copper barrier layer to prevent copper poisoning of the low-k dielectric layer. The functionalizing attaches a monolayer of a nitrogen containing group $NH_x$ 908 to the deposited amorphous carbon layer 224.

Figure 2D:
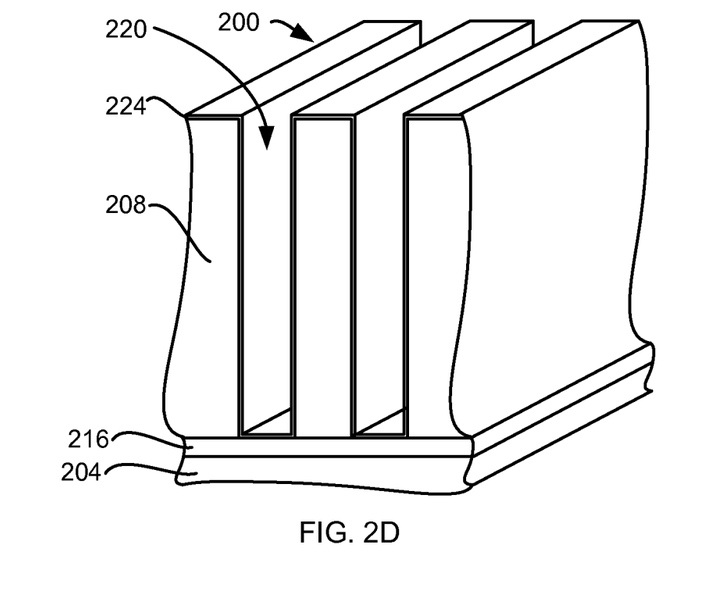

In this embodiment, the stack 200 is removed from the chamber 304 and may be removed from the cluster atmosphere, so that the stack 200 may be subjected to wet processes (step 124). In this embodiment, the stack 200 is subjected to a post etch wet clean 128, which is used to remove any residues from the stack 200. In other embodiments, the post etch wet clean may be performed at other times, such as after etching the low-k dielectric layer and before forming the amorphous carbon layer. In other embodiments, the stack 200 is not subjected to a post etch wet clean. An example of a recipe for a wet clean exposes the stack 200 to a solution of 200:1 of $H_2O$ and HF for two seconds.

Electroless conductive wires are then formed in the features (step 132) using an electroless process. In this embodiment, the stack 200 is placed in an acidic palladium chloride ($PdCl_2$) solution wet bath. $Pd^{2+}$ ions from the acidic $PdCl_2$ solution attach to the nitrogen functionalities of the functionalized conditioned amorphous carbon layer. FIG. 9 shows the chemisorbed Pd species 912 attached to the nitrogen containing groups 908. In an alternative embodiment, a nickel solution may be used. Because of the self limiting binding of the $Pd^{2+}$ ions with the nitrogen functionalities, a monolayer of palladium is formed that provides a nucleation layer for metal adhesion.

The acidic $PdCl_2$ wet bath is then followed by a deionized water rinse. The stack is then placed in an activation solution. This can be part of the electroless plating solution. The activation solution contains a reducing agent like DMAB dimethyl amine borane, formaldehyde or others.

Preferably, the forming the amorphous carbon barrier layer, conditioning the amorphous carbon barrier layer, and funtionalizing the conditioned amorphous carbon barrier layer are essentially oxygen free processes, so that no more than trace amounts of oxygen are used for such processes. More preferably, the forming the amorphous carbon barrier layer, conditioning the amorphous carbon barrier layer, and funtionalizing the conditioned amorphous carbon barrier layer are oxygen free processes, so that no oxygen is used during such processes.

An embodiment of the invention provides an amorphous carbon layer with a density that is able to act as a copper poison barrier layer and seal and protect the porous low-k barrier layer. In addition to protection from poisoning, a low-k barrier layer should be protected from damage that increases the k value of the low-k barrier layer. Preferably, the amorphous carbon layer has a thickness of 0.5 nm to 5 nm. It has been found that a conditioned amorphous carbon layer with such a thickness is sufficient barrier to copper poisoning. The combination of such a thick barrier layer with a monolayer for functionalization and a monolayer nucleation layer minimizes the support layers for the copper platting. For smaller features, the minimization of these support layers allows for a greater amount of copper to provide copper interconnects.

It has been found that using conventional TaN barrier layers with seed layers provides support layers that are much thicker, which reduce the volume of the copper in such small features. Such a reduction increases resistance in the interconnects.

In another embodiment, various combinations of steps may provide a cyclical process. For example, the forming the amorphous carbon layer (step 112) and the conditioning the amorphous carbon layer (step 116) may be provided in a cyclical process that alternates these steps for at least three cycles. Such a process for a plurality of cycles may be used to provide a thicker amorphous carbon layer.

In another manifestation of the invention, the invention is used for providing copper interconnects for through silicon vias. Such vias pass completely through a silicon substrate. A low-k dielectric layer may be placed on a side of the silicon substrate and forms part of the vias. The invention provides copper interconnects in the vias. In other embodiments a capacitively couple plasma (CCP) etch chamber may be used instead of a TCP etch chamber.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for providing electroless plating over a low-k dielectric layer, comprising:
   forming an amorphous carbon barrier layer over the low-k dielectric layer, comprising:
     providing a flow a deposition gas, comprising a hydrocarbon, $H_2$, and a first oxygen free diluent;
     forming a plasma from the deposition gas to provide the amorphous carbon barrier layer; and
     stopping the flow of the deposition gas;
   conditioning the amorphous carbon barrier layer, comprising:
     providing a flow of a conditioning gas comprising $H_2$ and a second oxygen free diluent;
     forming a plasma from the conditioning gas, which conditions a top surface of the amorphous carbon barrier layer; and
     stopping the flow of the conditioning gas; and
   functionalizing the conditioned amorphous carbon barrier layer for electroless plating, comprising:
     providing a flow of a functionalizing gas comprising $NH_3$ or $H_2$ and $N_2$;
     forming a plasma from the functionalizing gas; and
     stopping the flow of the functionalizing gas.

2. The method, as recited in claim 1, further comprising using an electroless process to provide an electroless plating over the functionalized and conditioned amorphous carbon barrier layer.

3. The method, as recited in claim 2, wherein features are etched in the low-k dielectric layer, and wherein the electroless plating forms metal interconnects in the etched features.

4. The method, as recited in claim 3, wherein the conditioning step trims, densifies, or via cleans the amorphous carbon barrier layer.

5. The method, as recited in claim 4, wherein the conditioning gas is essentially hydrocarbon free.

6. The method, as recited in claim 5, wherein the deposition gas is essentially ammonia free.

7. The method, as recited in claim 4, where the conditioning gas is absolutely hydrocarbon free.

8. The method, as recited in claim 7, wherein the low-k dielectric layer is of a porous low-k dielectric.

9. The method, as recited in claim 8, wherein the first or second oxygen free diluent consists essentially of at least one of noble gas or $N_2$.

10. The method, as recited in claim 9, wherein the first or second oxygen free diluent consists essentially of He.

11. The method, as recited in claim 9, wherein the hydrocarbon is a fluorine free hydrocarbon.

12. The method, as recited in claim 9, wherein the hydrocarbon is $CH_4$.

13. The method, as recited in claim 1, further comprising:
placing the low-k dielectric layer in a plasma processing chamber; and
etching features into the low-k dielectric layer.

14. The method, as recited in claim 13, wherein the etching features into the low-k dielectric layer, the forming the amorphous carbon barrier layer, the conditioning the amorphous carbon barrier layer, and the functionalizing the conditioned amorphous carbon barrier layer are done in situ in the same plasma processing chamber.

15. The method, as recited in claim 13, wherein the etching features into the low-k dielectric layer, the forming the amorphous carbon barrier layer, the conditioning the amorphous carbon barrier layer, and the functionalizing the conditioned amorphous carbon barrier layer are done in a cluster of plasma processing chambers.

16. The method, as recited in claim 1, further comprising a post etch wet clean of the low-k dielectric layer for removing etch residue.

17. The method, as recited in claim 1, wherein the conditioning the amorphous carbon barrier layer further comprises providing a bias to accelerate ionized oxygen free diluent to the low-k dielectric layer, wherein bias during conditioning the amorphous carbon barrier layer is greater than bias during forming amorphous carbon barrier layer and bias during functionalizing the conditioned amorphous carbon barrier layer.

18. The method, as recited in claim 1, wherein the functionalizing gas comprises $NH_3$.

* * * * *